United States Patent
Mizuno (10) Patent No.: US 8,227,976 B2
(45) Date of Patent: Jul. 24, 2012

(54) DISPLAY APPARATUS

(75) Inventor: Nobutaka Mizuno, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/194,153

(22) Filed: Jul. 29, 2011

(65) Prior Publication Data

US 2012/0032584 A1    Feb. 9, 2012

(30) Foreign Application Priority Data

Aug. 4, 2010 (JP) .................. 2010-175436
Jun. 17, 2011 (JP) .................. 2011-135602

(51) Int. Cl.
*H01J 1/62* (2006.01)
(52) U.S. Cl. ...................... 313/504; 313/506
(58) Field of Classification Search .......... 313/498, 313/504, 506

See application file for complete search history.

(56) References Cited

FOREIGN PATENT DOCUMENTS

JP    2004-127795 A    4/2004

*Primary Examiner* — Vip Patel
(74) *Attorney, Agent, or Firm* — Canon U.S.A., Inc. IP Division (57) ABSTRACT

A display apparatus includes an organic electroluminescent element that emits blue light, an organic electroluminescent element that emits green light, and an organic electroluminescent element that emits red light. An optical adjustment layer provided on the organic electroluminescent element that emits red light has a thickness $d_1$ that satisfies the following mathematical expression:

$$(4m_1-2\phi_1/\pi-3)\lambda_1/(8n_1) < d_1 < (4m_1-2\phi_1/\pi-1)\lambda_1/(8n_1)$$

where $\lambda_1$ denotes a maximum peak wavelength of a spectrum of light emitted from the organic electroluminescent element that emits red light, $n_1$ denotes a refractive index of the optical adjustment layer at the maximum peak wavelength $\lambda_1$, $\phi_1$ denotes a phase shift of light output from the organic electroluminescent element that emits red light when the light emitted therefrom is reflected at an interface of the optical adjustment layer that is opposite to a second electrode, and $m_1$ denotes a positive integer.

12 Claims, 4 Drawing Sheets

DISPLAY APPARATUS

BACKGROUND OF THE INVENTION

1. Field of the Invention

The present invention relates to display apparatuses equipped with organic electroluminescent elements.

2. Description of the Related Art

An organic electroluminescent (EL) element has a laminated structure constituted of a first electrode disposed on a substrate, an organic compound layer including a light-emitting layer, and a second electrode. One problem concerning organic EL elements is that the light emission efficiency is low. In an attempt to enhance light emission efficiency, Japanese Patent Application Laid-Open No. 2004-127795, for example, discloses an organic EL element having a resonator structure in which metal is used for both the first electrode and the second electrode.

Generally, the reflectivity of a thin metal film is high at a longer wavelength side of the visual light range. Therefore, if a thin metal film is to be used for the electrode at the light output side of an organic EL element, a resonance effect in an organic EL element that emits red light is greater than in organic EL elements that emit other colors.

This creates a problem in that the characteristics, such as chromaticity and light emission efficiency, of the red-light-emitting organic EL element with the large resonance effect change significantly in response to a change in thickness occurring when forming the organic compound layer or the like. Accordingly, a full-color display apparatus equipped with organic EL elements that emit red, blue, and green light, in which a thin metal film of this type is to be used for the electrode at the light output side, would display more vivid colors in the red side of the visible range than in other colors.

SUMMARY OF THE INVENTION

A display apparatus according to the present invention includes an organic electroluminescent element that emits blue light, an organic electroluminescent element that emits green light, and an organic electroluminescent element that emits red light. Each organic electroluminescent element has a first electrode, a light-emitting layer, and a second electrode. Light emitted from each organic electroluminescent element is output from the second electrode. A first optical adjustment layer having a thickness $d_1$ is provided on the second electrode of the organic electroluminescent element that emits red light. The thickness $d_1$ of the first optical adjustment layer satisfies the following mathematical expression A:

$$(4m_1-2\phi_1/\pi-3)\lambda_1/(8n_1) < d_1 < (4m_1-2\phi_1/\pi-1)\lambda_1/(8n_1) \quad (A)$$

where $\lambda_1$ denotes a maximum peak wavelength of a spectrum of light emitted from the organic electroluminescent element that emits red light, $n_1$ denotes a refractive index of the first optical adjustment layer at the maximum peak wavelength $\lambda_1$, $\phi_1$ denotes a phase shift of light output from the organic electroluminescent element that emits red light when the light emitted therefrom is reflected at an interface of the first optical adjustment layer that is opposite to the second electrode, and $m_1$ denotes a positive integer.

According to the present invention, a display apparatus equipped with an organic EL element that emits light with high efficiency is achieved.

Further features of the present invention will become apparent from the following description of exemplary embodiments with reference to the attached drawings.

DESCRIPTION OF THE EMBODIMENTS

A display apparatus according to an exemplary embodiment of the present invention will be described below with reference to the drawings. With regard to components not shown in the drawings or not described in this specification, such components are known in the technical field, or equivalent components in the related art are used. Furthermore, the exemplary embodiment to be described below is merely one embodiment of the invention and is not to be limited thereto.

Figure 1A:
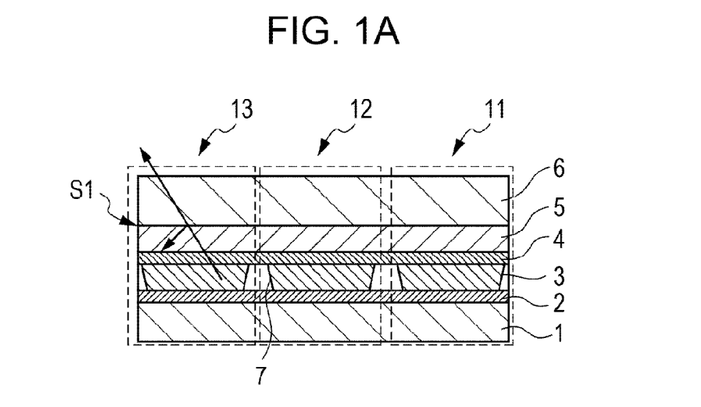
FIGS. 1A to 1C schematically illustrate a display apparatus equipped with organic EL elements according to the present invention.

FIG. 1A is a schematic cross-sectional view of a display apparatus having organic electroluminescent (EL) elements, one of which emits red light, according to the present invention. The display apparatus has a substrate 1 on which an organic EL element 11 that emits blue light, an organic EL element 12 that emits green light, and an organic EL element 13 that emits red light are disposed. Each organic EL element has a first electrode 2, an organic compound layer 3 that includes a light-emitting layer, and a second electrode 4 in that order. Moreover, a protection layer 6 is disposed on the organic EL elements. The light emitted from each organic EL element is output from the second electrode 4 side. Partitions 7 are disposed between the organic EL elements.

The protection layer 6 extends with the same thickness over the multiple organic EL elements (i.e., the organic EL element 11, the organic EL element 12, and the organic EL element 13).

An optical adjustment layer 5 is disposed between the second electrode 4 of each organic EL element and the protection layer 6. The optical adjustment layer 5 may be constituted of a single layer or multiple layers. If the optical adjustment layer 5 is constituted of multiple layers, two adjacent layers of the multiple layers preferably have different refractive indices.

Figure 2:
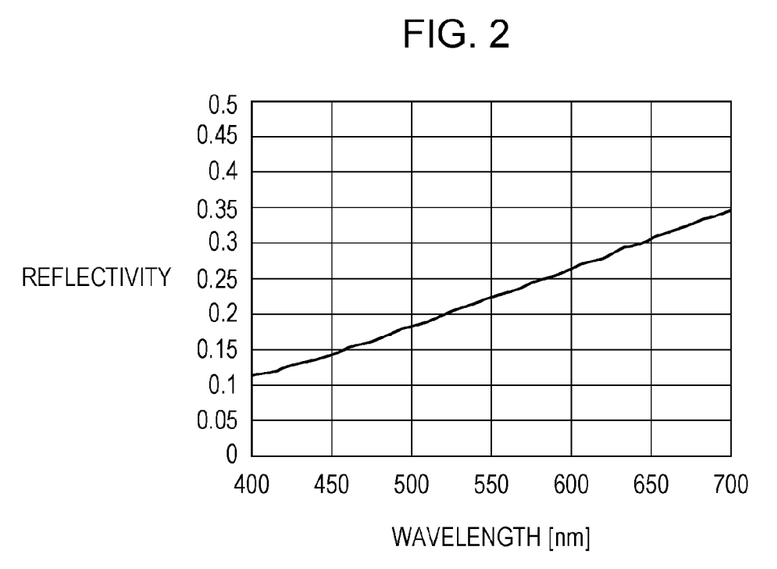
FIG. 2 illustrates wavelength dispersion relative to reflectivity in a thin silver film.

FIG. 2 illustrates wavelength dispersion relative to reflectivity when a thin silver (Ag) film with a thickness of 10 nm is used for the second electrode 4. Specifically, when each second electrode 4 serving as a light-extracting electrode of each organic EL element is formed of a thin metal film with a thickness ranging between 5 nm and 20 nm, as in this drawing, the reflectivity of the second electrode 4 is higher in a long-wavelength (red side) region. For this reason, a resonance effect of the organic EL element that emits red light increases, causing the light extraction efficiency thereof to become relatively greater than that for other colors. Thus, the characteristics, such as chromaticity and light emission efficiency, of the organic EL element 13 that emits red light change significantly in response to a change in thickness occurring when forming the organic compound layer 3 or the like, thus resulting in reduced robustness. The term "resonance effect" refers to an effect in which light emitted from a light-emitting layer is intensified by utilizing an optical interference effect between a reflection surface at the first electrode 2 side and a reflection surface at the second electrode 4 side.

In consideration of the above, in the present invention, the optical adjustment layer 5 is specifically designed for attenuating the resonance effect of the organic EL element 13 that emits red light. Specifically, the thickness of the optical adjustment layer 5 is set such that the phases of the red light emitted from the light-emitting layer of the organic EL element 13 and reflected at two interfaces of the optical adjustment layer 5 are opposite of each other (i.e., shifted by 180 degrees or $\pi$ radians). More specifically, a thickness $d_1$ of the optical adjustment layer 5 is designed so as to satisfy the following mathematical expression 1:

$$2n_1 d_1/\lambda_1 + \phi_1/2\pi = m_1 - 1/2 \quad (1)$$

where $\lambda_1$ denotes a maximum peak wavelength of a spectrum of light emitted from the organic EL element 13, $n_1$ denotes a refractive index of the optical adjustment layer 5 at the maximum peak wavelength $\lambda_1$, $\phi_1$ denotes a phase shift of the red light output from the organic EL element 13 when the red light is reflected at an interface (surface or plane) of the optical adjustment layer 5 that is opposite to the second electrode 4, and $m_1$ denotes a positive integer. Specifically, during operation, the light-emitting layer of the organic EL element 13 generates light in the red wavelength region (red light). Part of the red light is directly emitted through the second electrode 4 and the optical adjustment layer 5. However, part of the red light is reflected at a surface S1 (interface) of the optical adjustment layer 5 and is subsequently emitted through the second electrode 4 and the optical adjustment layer 5. Accordingly, $\phi_1$ denotes the amount phase shift of the red light output from the organic EL element 13 when the red light is reflected at the surface S1 of the optical adjustment layer 5. As illustrated in FIG. 1A, the surface S1 of the optical adjustment layer 5 is opposite to the second electrode 4.

The aforementioned expression 1 is sometimes not satisfied due to a formation error occurring when forming each organic compound layer 3 and the optical adjustment layer 5 or due to the effect of light-emission distribution within the light-emitting layer. However, even if a value of an optical thickness $n_1 d_1$ of the optical adjustment layer 5 is deviated from a value satisfying the expression 1 by about $\pm \lambda_1/8$, the resonance effect of the organic EL element 13 that emits red light is sufficiently attenuated. Therefore, the thickness $d_1$ of the optical adjustment layer 5 may satisfy the following relational expression A. In this case, $d_1 > 0$.

$$(4m_1 - 2\phi_1/\pi - 3)\lambda_1/(8n_1) < d_1 < (4m_1 - 2\phi_1/\pi - 1)/(8n_1) \quad (A)$$

With this configuration, the resonance effect of the organic EL element that emits red light is attenuated so that the possibility of a change in the characteristics, such as chromaticity and light emission efficiency, thereof is reduced, thereby achieving increased robustness. It should be noted that although FIG. 1A shows the adjustment layer 5 being disposed over each of the organic EL elements 11, 12 and 13, the optical adjustment layer 5 may alternatively be disposed only on the organic EL element 13 that emits red light.

Furthermore, it is preferable that the optical thickness $n_1 d_1$ of the optical adjustment layer 5 be set such that the value of the optical thickness $n_1 d_1$ of the optical adjustment layer 5 is within a range deviated from the value satisfying the expression 1 by about $\pm \lambda_1/16$. Specifically, the thickness $d_1$ of the optical adjustment layer 5 preferably satisfies the following relational expression A':

$$(8m_1 - 4\phi_1/\pi - 5)\lambda_1/(16n_1) \leq d_1 \leq (8m_1 - 4\phi_1/\pi - 3)\lambda_1/(16n_1) \quad (A')$$

The characteristic shown in FIG. 2 is prominent when a thin metal film including Ag is used for the second electrode 4. However, because the reflectivity of a thin metal film with a thickness ranging between 5 nm and 20 nm generally decreases toward the shorter wavelength side, each second electrode 4 is not limited to a thin Ag film or a thin metal film including Ag. The present invention is applicable so long as the resonance effect of the organic EL element 13 that emits red light is greater than that of the organic EL elements that emit other colors. For example, the present invention is applicable to organic EL elements having resonator structures, in which the resonator structure of the organic EL element that emits red light utilizes a higher-order optical interference effect as compared with elements that emit other colors.

Figure 1B:
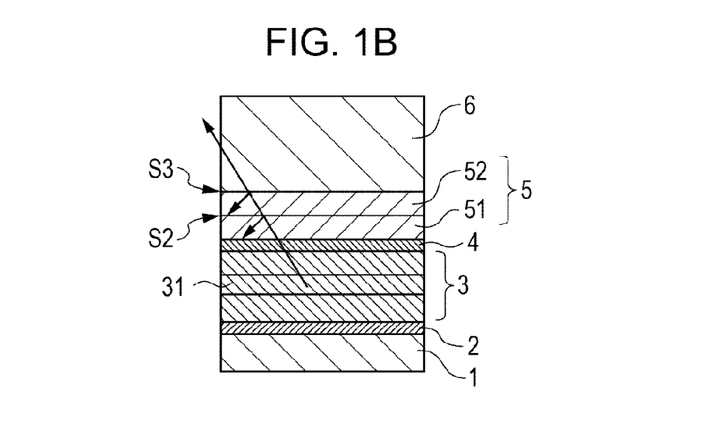

FIG. 1B illustrates an example in which the optical adjustment layer 5 is constituted of multiple layers including a first optical adjustment layer 51 disposed on the second electrodes 4 and a second optical adjustment layer 52 disposed on the first optical adjustment layer 51. The first optical adjustment layer 51 and the second optical adjustment layer 52 are both disposed commonly over the organic EL elements. The first optical adjustment layer 51 and the second optical adjustment layer 52 are preferably composed of materials with different refractive indices. The thickness of the first optical adjustment layer 51 satisfies the aforementioned expression A, and a thickness $d_2$ of the second optical adjustment layer 52 satisfies the following mathematical expression B:

$$(4m_2 - 2\phi_2/\pi - 1)\lambda_2/(8n_2) < d_2 < (4m_2 - 2\phi_2/\pi + 1)\lambda_2/(8n_2) \quad (B)$$

where $\lambda_2$ denotes a maximum peak wavelength of a spectrum of light extracted from the organic EL element 11 that emits blue light, $n_2$ denotes a refractive index of the second optical adjustment layer 52 at the maximum peak wavelength $\lambda_2$, $\phi_2$ denotes a sum of a phase shift amount of the blue light output from the organic EL element 11 when the blue light is reflected at an interface S2 between the first optical adjustment layer 51 and the second optical adjustment layer 52 plus a phase shift amount of the blue light output from the organic EL element 11 when the blue light is reflected at an interface S3 of the second optical adjustment layer 52 that is opposite to the first optical adjustment layer 51, and $m_2$ denotes a positive integer.

The thickness $d_2$ of the second optical adjustment layer 52 more preferably satisfies the following mathematical expression B'. Moreover, it is most preferable that the thickness $d_2$ of the second optical adjustment layer 52 satisfy the following mathematical expression B".

$$(8m_2 - 4\phi_2/\pi - 1)\lambda_2/(16n_2) \leq d_2 \leq (8m_2 - 4\phi_2/\pi + 1)\lambda_2/(16n_2) \quad (B')$$

$$2n_2 d_2/\lambda_2 + \phi_2/2\pi = m_2 \quad (B'')$$

The above mathematical expression is based on the fact that, when each second electrode 4 serving as a light-extracting electrode is formed of a thin metal film with a thickness ranging between 5 nm and 20 nm, as in FIG. 2, the reflectivity of the second electrode 4 decreases in the short-wavelength (blue side) region. By forming the second optical adjustment layer 52 such that the aforementioned expressions B, B', and B" are satisfied, the phases of the blue light emitted from the organic EL element 11 and reflected at both interfaces S2, S3 of the second optical adjustment layer 52 become closer to each other so that the resonance effect of the organic EL element 11 can be intensified, thereby increasing the light extraction efficiency of blue light.

In the display apparatus according to the present invention, the light emission efficiency of the organic EL element 11 that emits blue light can be increased, whereas the light emission efficiency of the organic EL element 13 that emits red light can be reduced, thereby allowing for well-balanced brightness when white light is displayed and also allowing for reduced power consumption.

Figure 1C:
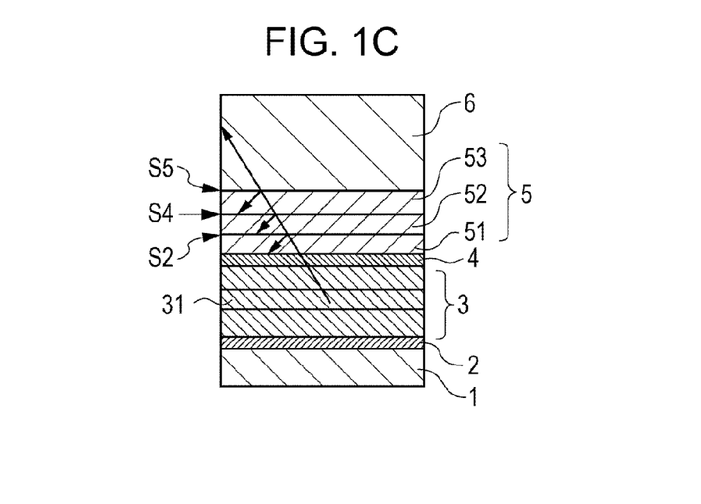

Referring to FIG. 1C, a third optical adjustment layer 53, in addition to the above-described first adjustment layer 51 and second adjustment layer 52, may be provided on the second optical adjustment layer 52 on each of the organic EL elements. Specifically, the phases of blue light when reflected at both interfaces S4, S5 of the third optical adjustment layer 53 may be matched, and the resonance effect of the organic EL element 11 that emits blue light may be intensified by using the second optical adjustment layer 52 and the third optical adjustment layer 53. In this case, the third optical adjustment layer 53 is composed of a material with a refractive index different from that of the second optical adjustment layer 52. A thickness $d_3$ of the third optical adjustment layer 53 satisfies the following relational expression C:

$$(4m_3-2\phi_3/\pi-1)\lambda_2/(8n_3)<d_3<(4m_3-2\phi_3/\pi+1)\lambda_2/(8n_3) \quad (C)$$

where $n_3$ denotes a refractive index of the third optical adjustment layer 53 at the aforementioned maximum peak wavelength $\lambda_2$, $\phi_3$ denotes a sum of a phase shift amount of the blue light output from the organic EL element 11 when the blue light is reflected at an interface S4 between the second optical adjustment layer 52 and the third optical adjustment layer 53 plus a phase shift amount of the blue light output from the organic EL element 11 when the blue light is reflected at an interface S5 of the third optical adjustment layer 53 that is opposite to the second optical adjustment layer 52, and $m_3$ denotes a positive integer.

The thickness $d_3$ of the third optical adjustment layer 53 more preferably satisfies the following mathematical expression C'. Moreover, it is most preferable that the thickness $d_3$ of the third optical adjustment layer 53 satisfy the following mathematical expression C''.

$$(8m_3-4\phi_3/\pi-1)\lambda_3/(16n_3)\leq d_3\leq(8m_3-4\phi_3/\pi+1)\lambda_3/(16n_3) \quad (C')$$

$$2n_3d_3/\lambda_3+\phi_3/2\pi=m_3 \quad (C'')$$

Furthermore, it is desirable that the thickness $d_1$ in the case where the optical adjustment layer 5 is constituted of a single layer and the thickness $d_1$ of the first optical adjustment layer 51 in the case where the optical adjustment layer 5 is constituted of multiple layers satisfy the aforementioned expression A or the aforementioned expression A', and also satisfy at least one of the following mathematical expressions D, D', and D'':

$$(4m_4-2\phi_4/\pi-1)\lambda_2/(8n_4)<d_1<(4m_4-2\phi_4/\pi+1)\lambda_2/(8n_4) \quad (D)$$

$$(8m_4-4\phi_4/\pi-1)\lambda_2/(16n_4)\leq d_1\leq(8m_4-4\phi_4/\pi+1)\lambda_2/(16n_4) \quad (D')$$

$$2n_4d_1/\lambda_2+\phi_4/2\pi=m_4 \quad (D'')$$

where $\lambda_2$ denotes a maximum peak wavelength of a spectrum of light extracted from the organic EL element 11 that emits blue light, $n_4$ denotes a refractive index of the optical adjustment layer 5 (or the first optical adjustment layer 51) at the maximum peak wavelength $\lambda_2$, $\phi_4$ denotes a phase shift amount of the blue light output from the organic EL element 11 when the blue light is reflected at the interface S1 of the optical adjustment layer 5 (or the first optical adjustment layer 51) that is opposite to the second electrode 4, and $m_4$ denotes a positive integer.

With this configuration, the optical adjustment layer 5 or the first optical adjustment layer 51 can attenuate the resonance effect of the organic EL element 13 that emits red light and can intensify the resonance effect of the organic EL element 11 that emits blue light. In order to satisfactorily intensify the resonance effect of the organic EL element 11 that emits blue light, it is more preferable that the expression D' be satisfied rather than the expression D, or the expression D'' rather than the expression D'.

In the case where the optical adjustment layer 5 is constituted of multiple layers, it is desirable that the thickness $d_2$ of the second optical adjustment layer 52 satisfy the aforementioned expression B or B' and also satisfy at least one of the following mathematical expressions E, E', and E'':

$$(4m_5-2\phi_5/\pi-3)\lambda_1/(8n_5)<d_2<(4m_5-2\phi_5/\pi-1)\lambda_1/(8n_5) \quad (E)$$

$$(8m_5-4\phi_5/\pi-5)\lambda_1/(16n_5)\leq d_2\leq(8m_5-4\phi_5/\pi-3)\lambda_1/(16n_5) \quad (E')$$

$$2n_5d_2/\lambda_1+\phi_5/2\pi=m_5-1/2 \quad (E'')$$

where $\lambda_1$ denotes a maximum peak wavelength of a spectrum of light extracted from the organic EL element 13 that emits red light, $n_5$ denotes a refractive index of the second optical adjustment layer 52 at the maximum peak wavelength $\lambda_1$, $\phi_5$ denotes a sum of a phase shift amount of the red light output from the organic EL element 13 when the red light is reflected at the interface S2 between the first optical adjustment layer 51 and the second optical adjustment layer 52 plus a phase shift amount of the red light output from the organic EL element 13 when the red light is reflected at the interface S3 of the second optical adjustment layer 52 that is opposite to the first optical adjustment layer 51, and $m_5$ denotes a positive integer.

With this configuration, the second optical adjustment layer 52 can intensify the resonance effect of the organic EL element 11 that emits blue light and can attenuate the resonance effect of the organic EL element 13 that emits red light. In order to satisfactorily attenuate the resonance effect of the organic EL element 13 that emits red light, it is more preferable that the expression E' be satisfied rather than the expression E, or the expression E'' rather than the expression E'.

In the case where the optical adjustment layer 5 further includes the third optical adjustment layer 53, it is desirable that the thickness $d_3$ thereof satisfy the aforementioned expression C or C' and also satisfy at least one of the following mathematical expressions F, F', and F'':

$$(4m_6-2\phi_6/\pi-3)\lambda_1/(8n_6)<d_3<(4m_6-2\phi_6/\pi-1)\lambda_1/(8n_6) \quad (F)$$

$$(8m_6-4\phi_6/\pi-5)\lambda_1/(16n_6)\leq d_3\leq(8m_6-4\phi_6/\pi-3)\lambda_1/(16n_6) \quad (F')$$

$$2n_6d_3/\lambda_1+\phi_6/2\pi=m_6-1/2 \quad (F'')$$

where $\lambda_1$ denotes a maximum peak wavelength of a spectrum of light extracted from the organic EL element 13 that emits red light, $n_6$ denotes a refractive index of the third optical adjustment layer 53 at the maximum peak wavelength $\lambda_1$, $\phi_6$ denotes a sum of a phase shift amount of the red light output from the organic EL element 13 when the red light is reflected at the interface S4 between the second optical adjustment layer 52 and the third optical adjustment layer 53 plus a phase shift amount of the red light output from the organic EL element 13 when the red light is reflected at the interface S5 of the third optical adjustment layer 53 that is opposite to the second optical adjustment layer 52, and $m_6$ denotes a positive integer.

With this configuration, the third optical adjustment layer 53 can intensify the resonance effect of the organic EL element 11 that emits blue light and can attenuate the resonance effect of the organic EL element 13 that emits red light. In order to satisfactorily attenuate the resonance effect of the organic EL element 13 that emits red light, it is more preferable that the expression F' be satisfied rather than the expression F, or the expression F'' rather than the expression F'.

The substrate 1 is an insulating substrate provided with a switching element (not shown), such as a thin film transistor, and is composed of glass or plastic.

Each first electrode 2 may be a metallic layer composed of a single metal, such as aluminum, chromium, or silver, or an alloy of these metals. Alternatively, the first electrode 2 may be formed by stacking upon each other a transparent oxide conductive layer, such as a compound layer of indium oxide and tin oxide or a compound layer of indium oxide and zinc oxide, over a metallic layer. If the first electrode 2 is formed of a metallic layer alone, the reflective surface of the first electrode 2 is an interface between the metallic layer (i.e., the first electrode 2) and the organic compound layer 3. If the first electrode 2 is formed of two layers, i.e., a metallic layer and a transparent oxide conductive layer, the reflective surface of the first electrode 2 is an interface between the metallic layer and the transparent oxide conductive layer. The first electrode 2 preferably has a thickness ranging between 50 nm and 200 nm. The term "transparent" refers to a light transmittance of 50% or higher in the visual light range (i.e., a wavelength range between 400 nm and 780 nm).

Each organic compound layer 3 at least has the light-emitting layer. In addition, the organic compound layer 3 may have a charge transport layer, such as a hole transport layer or an electron transport layer, where necessary, and may also have a hole blocking layer. Each layer may be composed of a known material and may be formed by a known film formation technique, such as a deposition technique or a transfer technique. By optimizing the thickness of the organic compound layer 3 for each color, the light emission efficiency of the organic EL elements for the individual colors can be increased.

Each second electrode 4 may be a thin metal film composed of a single metal, such as aluminum, chromium, or silver, or an alloy of these metals. In particular, a thin metal film including Ag is desirably used as the second electrode 4 due to having low absorbability and low specific resistance. The second electrode 4 preferably has a thickness ranging between 5 nm and 20 nm. Alternatively, the second electrode 4 may be formed by stacking upon each other a transparent oxide conductive layer, such as a compound layer of indium oxide and tin oxide or a compound layer of indium oxide and zinc oxide, over the aforementioned thin metal film. The reflective surface of the second electrode 4 is an interface between the thin metal film (i.e., the second electrode 4) and the organic compound layer 3.

The protection layer 6 can be formed by using a known material and by a known film formation technique. One example includes forming a silicon nitride (SiN) film by using a chemical vapor deposition (CVD) device. Titanium oxide may also be used as an alternative. In order to achieve sealing capability, the protection layer 6 is given a thickness that is generally in the order of micrometers and that is not affected by an optical interference effect.

The material used for the optical adjustment layer 5 is not particularly limited, and may either be an organic material or an inorganic material. Examples of such a material include $SiO_2$, $TiO_2$, LiF, $MgF_2$, $CF_x$, and the same material as that of the organic compound layer 3. A greater difference in refractive indices (i.e., a difference of 0.2 or greater) between adjacent optical adjustment layers (i.e., the first optical adjustment layer 51 and the second optical adjustment layer 52, and the second optical adjustment layer 52 and the third optical adjustment layer 53) is more preferred for performing optical adjustment due to higher reflectivity. A reflectivity R at an interface when light enters a medium with a refractive index $n_B$ from a medium with a refractive index $n_A$ is expressed by the following mathematical expression 2:

$$R = (n_A - n_B)^2 / (n_A + n_B)^2 \qquad (2)$$

Furthermore, the optical adjustment layer 5 is desirably formed by alternately stacking a high-refractive-index layer (with a refractive index higher than 1.7) and a low-refractive-index layer (with a refractive index lower than or equal to 1.7). If the first optical adjustment layer 51 is a high-refractive-index layer, the second optical adjustment layer 52 is desirably a low-refractive-index layer. In the optical adjustment layer 5, a layer in contact with the protection layer 6 preferably has a refractive index that is higher than that of the protection layer 6, and a difference in refractive indices therebetween is preferably 0.5 or greater.

The thickness of each of the layers constituting the optical adjustment layer 5 preferably ranges between 10 nm and 150 nm.

FIRST PRACTICAL EXAMPLE

A display apparatus according to this practical example includes organic EL elements (11, 12, and 13) that emit blue light, green light, and red light, respectively, as shown in FIGS. 1A and 1B. First electrodes 2 corresponding to the respective organic EL elements are disposed on a substrate 1. An organic compound layer 3 including a light-emitting layer 31 is disposed on each first electrode 2. The thickness of each organic compound layer 3 is optimized for utilizing the resonance effect for each color. A second electrode 4 formed of a thin metal film extends over the organic compound layer 3 of each organic EL element.

An optical adjustment layer 5 is disposed (stacked) on the second electrodes 4. A protection layer 6 is disposed on the optical adjustment layer 5. In the drawings, the optical adjustment layer 5 and the protection layer 6 are disposed commonly over the organic EL elements. However, as noted above, the optical adjustment layer 5 may be selectively disposed on at least one of the organic EL elements. The optical adjustment layer 5 includes a first optical adjustment layer 51 and a second optical adjustment layer 52. Exemplary materials, refractive indices, and thicknesses of the layers in the optical adjustment layer 5 and the protection layer 6 for the first practical example are shown in Table 1.

TABLE 1

|  | MATERIAL | REFRACTIVE INDEX | THICKNESS (nm) |
|---|---|---|---|
| PROTECTION LAYER | SiN | 1.6 | 10000 |
| SECOND OPTICAL ADJUSTMENT LAYER | $SiO_2$ | 1.5 | 77 |
| FIRST OPTICAL ADJUSTMENT LAYER | $TiO_2$ | 2.7 | x |
| SECOND ELECTRODE | Ag |  | 12 |

Figure 3:
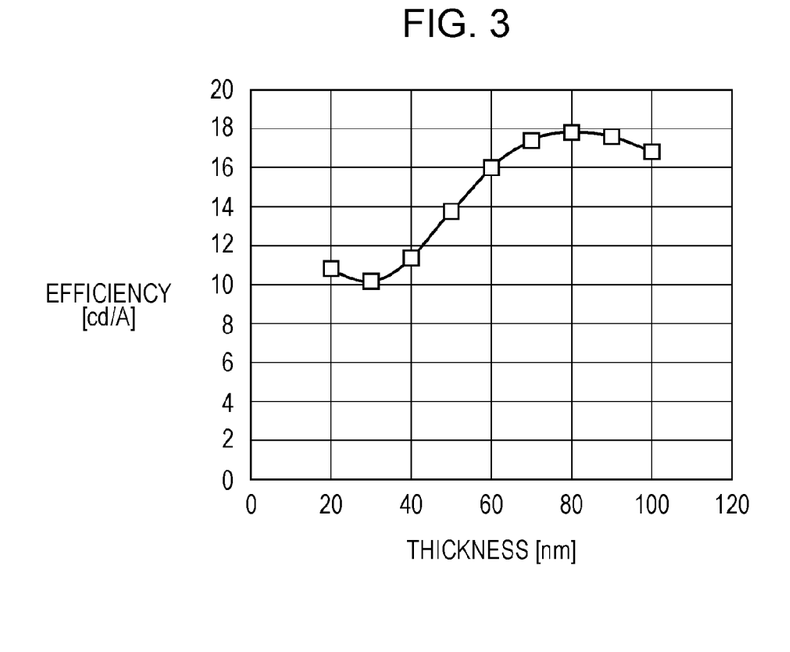
FIG. 3 illustrates the relationship between the thickness of a first optical adjustment layer and light emission efficiency in a first practical example of the present invention.

FIG. 3 illustrates the relationship between a thickness x of the first optical adjustment layer 51 and the light emission efficiency of the organic EL element 13 that emits red light. It can be appreciated from FIG. 3 that the light emission efficiency is at a minimum when the first optical adjustment layer 51 has a thickness of approximately 30 nm. In this practical example, a maximum peak wavelength $\lambda_1$ of a spectrum of red light emitted from the organic EL element 13 is centered at 620 nm. A phase shift amount $\phi_1$ of light output from the corresponding second electrode 4 when the light is reflected at the interface S1 of the first optical adjustment layer 51 that is opposite to the second electrode 4 (the interface S2 between the first optical adjustment layer and the second optical adjustment layer) is approximately zero. Therefore, the thickness of the first optical adjustment layer 51 satisfies the expression A when $m_1=1$.

Figure 4:
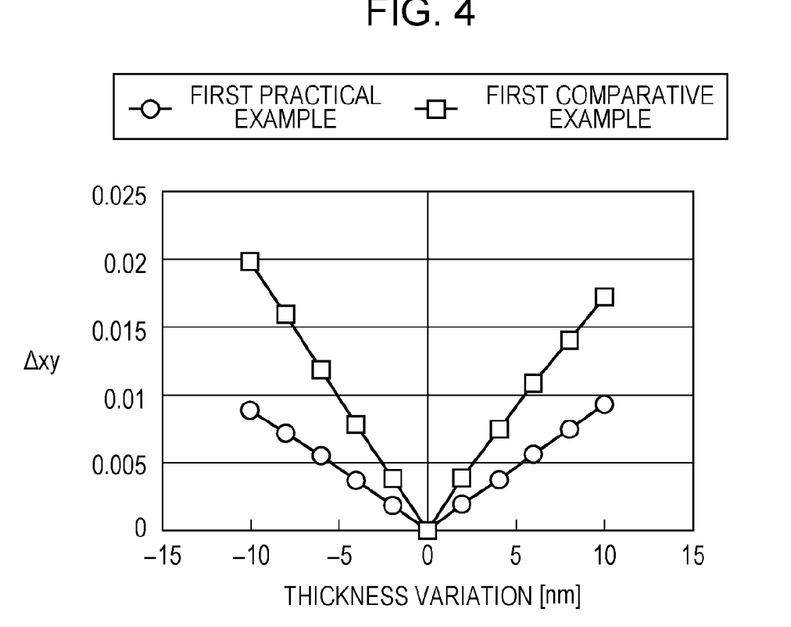
FIG. 4 illustrates the relationship between a thickness variation in organic compound layers and a chromaticity variation in the first practical example of the present invention and a first comparative example.

FIG. 4 illustrates a comparison between the first practical example in which the thickness x of the first optical adjustment layer 51 is 30 nm and a first comparative example in which the optical adjustment layer 5 is not provided for the organic EL elements. Specifically, in FIG. 4, the relationship between a thickness variation in the organic compound layers 3 and a chromaticity variation $\Delta xy$ from set values $(x_0, y_0)$ is shown. The set values $(x_0, y_0)$ are NTSC chromaticity coordinates (0.67, 0.33) for red color. As shown in FIG. 4, the chromaticity variation relative to the thickness variation is smaller in the first practical example than in the first comparative example. For example, in order to achieve $\Delta xy \leq 0.01$, the thickness variation in the organic compound layers 3 is about $\pm 5$ nm in the first comparative example, whereas the thickness variation in the organic compound layers 3 is $\pm 10$ nm in the first practical example. Thus, the first practical example provides a broader thickness-variation allowance, thereby achieving increased robustness.

The second optical adjustment layer 52 has a thickness of 77 nm, which is set so as to satisfy the expression B. A maximum peak wavelength $\lambda_2$ of a spectrum of blue light emitted from the organic EL element 11 is 460 nm. A sum $\phi_2$ of a phase shift amount of the blue light output from the organic EL element 11 when the blue light is reflected at the interface S2 between the first optical adjustment layer 51 and the second optical adjustment layer 52 plus a phase shift amount of the blue light output from the organic EL element 11 when the blue light is reflected at the interface S3 of the second optical adjustment layer 52 that is opposite to the first optical adjustment layer 51 is approximately $\pi$. A positive integer $m_2$ is 1.

Table 2 shows light-emission efficiency ratios between the organic EL elements that emit the respective colors and power consumption ratios at that time in the first practical example and the first comparative example.

TABLE 2

|  | RED | GREEN | BLUE | POWER |
| --- | --- | --- | --- | --- |
| FIRST PRACTICAL EXAMPLE | 0.70 | 1.06 | 1.68 | 0.91 |
| FIRST COMPARATIVE EXAMPLE | 1.00 | 1.00 | 1.00 | 1.00 |

Due to the broader thickness-variation allowance in this practical example, the resonance effect for red light is attenuated by the first optical adjustment layer 51 so that the light emission efficiency of red light is lower than that in the comparative example. On the other hand, since the second optical adjustment layer 52 intensifies the resonance effect at the shorter wavelength side, the light emission efficiency for green and blue colors are higher than that in the comparative example. As a result, a display apparatus that consumes less power can be achieved in this practical example.

Although the optical adjustment layer 5 is constituted of two layers, i.e., the first optical adjustment layer 51 and the second optical adjustment layer 52, in this practical example, the optical adjustment layer 5 may alternatively be constituted of a single layer to increase the robustness of the organic EL element 13 that emits red light. In addition, the optical adjustment layer 5 may be disposed only on the organic EL element 13 that emits red light.

SECOND PRACTICAL EXAMPLE

As shown in FIG. 1C, the second practical example differs from the first practical example in that the optical adjustment layer 5 is constituted of a first optical adjustment layer 51, a second optical adjustment layer 52, and a third optical adjustment layer 53. Exemplary materials, refractive indices, and thicknesses of the first optical adjustment layer 51, the second optical adjustment layer 52, the third optical adjustment layer 53, and the protection layer 6 for the second practical example are shown in Table 3.

TABLE 3

|  | MATERIAL | REFRACTIVE INDEX | THICKNESS (nm) |
| --- | --- | --- | --- |
| PROTECTION LAYER | $SiN_x$ | 1.6 | 10000 |
| THIRD OPTICAL ADJUSTMENT LAYER | IZO | 2.0 | 58 |
| SECOND OPTICAL ADJUSTMENT LAYER | LiF | 1.4 | 77 |
| FIRST OPTICAL ADJUSTMENT LAYER | IZO | 2.0 | x |
| SECOND ELECTRODE | Ag |  | 12 |

Figure 5:
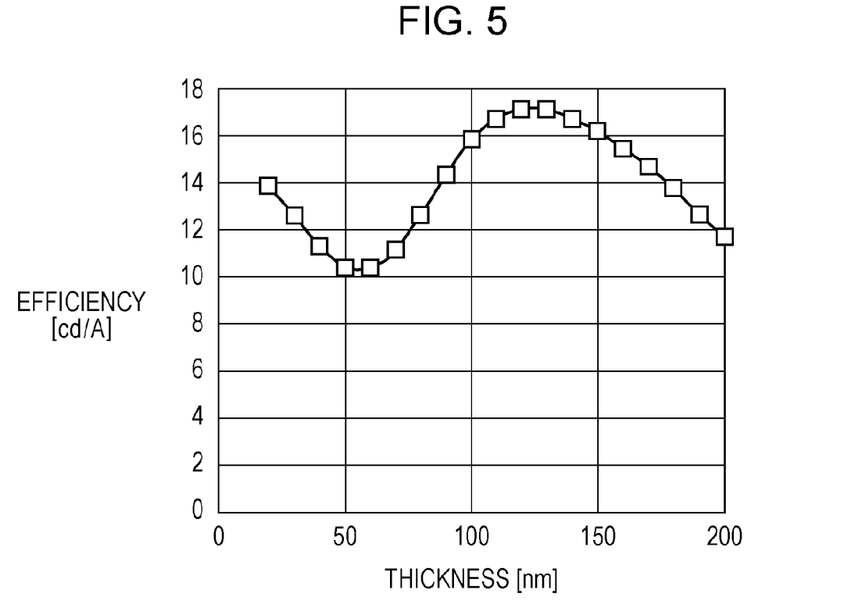
FIG. 5 illustrates the relationship between the thickness of the first optical adjustment layer and light emission efficiency in a second practical example of the present invention.

FIG. 5 illustrates the relationship between a thickness x of the first optical adjustment layer 51 and the light emission efficiency of the organic EL element 13 that emits red light. It can be appreciated from FIG. 5 that the light emission efficiency is at a minimum when the first optical adjustment layer 51 has a thickness of approximately 60 nm. In this practical example, a maximum peak wavelength $\lambda_1$ of a spectrum of red light emitted from the organic EL element 13 was found to be centered at 620 nm. A phase shift amount $\phi_1$ of light output from the second electrode 4 when the light is reflected at the interface S1 of the first optical adjustment layer 51 that is opposite to the second electrode 4 (the interface S2 between the first optical adjustment layer and the second optical adjustment layer) is approximately zero. Therefore, the thickness of the first optical adjustment layer 51 satisfies the expression A when $m_1=1$.

Figure 6:
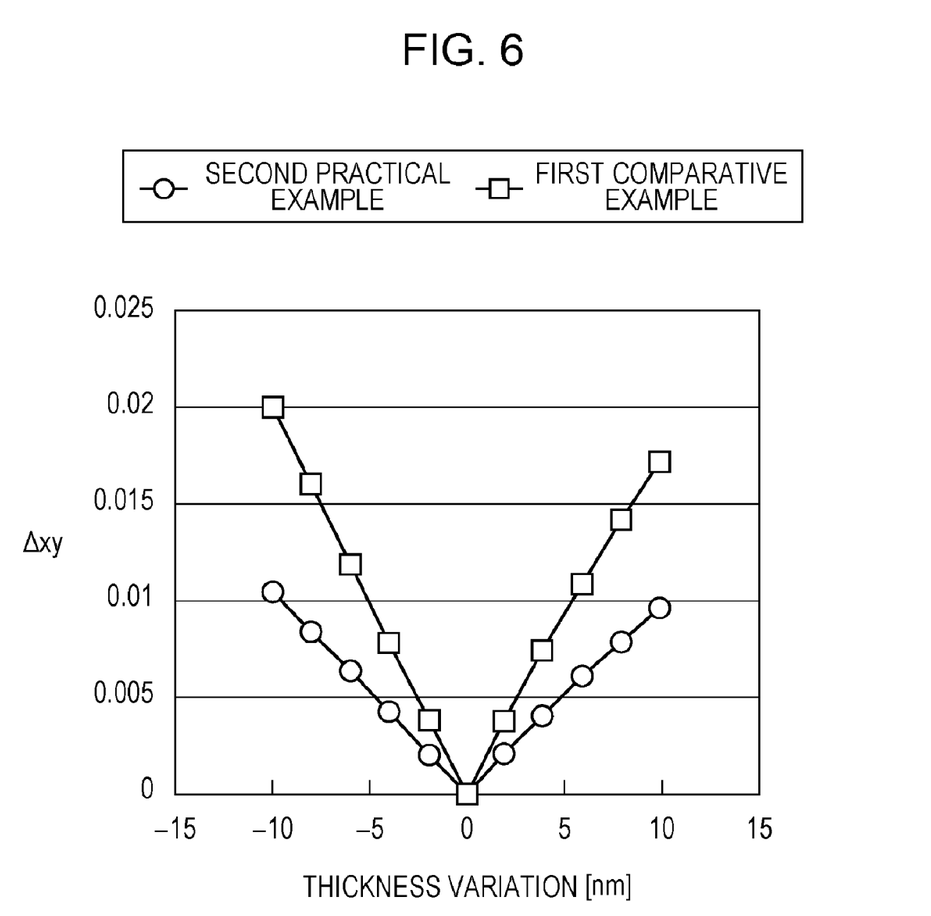
FIG. 6 illustrates the relationship between a thickness variation in the organic compound layers and a chromaticity variation in the second practical example of the present invention and the first comparative example.

FIG. 6 illustrates a comparison between the second practical example in which the thickness x of the first optical adjustment layer 51 is 60 nm and the first comparative example in which the optical adjustment layer 5 is not provided for the organic EL elements. Specifically, in FIG. 6, the relationship between a thickness variation in the organic compound layers 3 and a chromaticity variation $\Delta xy$ from set values $(x_0, y_0)$ is shown. The set values are the same as those in the first practical example. As shown in FIG. 6, the chromaticity variation relative to the thickness variation is smaller in the second practical example than in the first comparative example. For example, in order to achieve $\Delta xy \leq 0.01$, the thickness variation in the organic compound layers 3 is about $\pm 5$ nm in the first comparative example, whereas the thickness variation in the organic compound layers 3 is $\pm 10$ nm in the second practical example. Thus, the second practical example provides a broader thickness-variation allowance, thereby achieving increased robustness.

The second optical adjustment layer 52 has a thickness of 77 nm, which is set so as to satisfy the expression B. A maximum peak wavelength $\lambda_2$ of a spectrum of blue light emitted from the organic EL element 11 is 460 nm. A sum $\phi_2$ of a phase shift amount of the blue light output from the organic EL element 11 when the blue light is reflected at the interface S2 between the first optical adjustment layer 51 and the second optical adjustment layer 52 plus a phase shift amount of the blue light output from the organic EL element 11 when the blue light is reflected at the interface S3 of the second optical adjustment layer 52 that is opposite to the first optical adjustment layer 51 (the interface S4 between the second optical adjustment layer 52 and the third optical adjustment layer 53) is approximately $\pi$. A positive integer $m_2$ is 1.

The third optical adjustment layer 53 has a thickness of 58 nm, which is set so as to satisfy the expression C. A sum $\phi_3$ of a phase shift amount of the blue light output from the organic EL element 11 when the blue light is reflected at the interface S4 between the second optical adjustment layer 52 and the third optical adjustment layer 53 plus a phase shift amount of the blue light output from the organic EL element 11 when the blue light is reflected at the interface S5 of the third optical adjustment layer 53 that is opposite to the second optical adjustment layer 52 is approximately $\pi$. A positive integer $m_3$ is 1.

Table 4 shows light-emission efficiency ratios between the organic EL elements that emit the respective colors and power consumption ratios at that time in the second practical example and the first comparative example.

TABLE 4

|  | RED | GREEN | BLUE | POWER |
|---|---|---|---|---|
| SECOND PRACTICAL EXAMPLE | 0.73 | 1.12 | 1.64 | 0.89 |
| FIRST COMPARATIVE EXAMPLE | 1.00 | 1.00 | 1.00 | 1.00 |

Due to the broader thickness-variation allowance in the second practical example, the resonance effect for red light is attenuated by the first optical adjustment layer 51 so that the light emission efficiency of red light is lower than that in the comparative example. On the other hand, since the second optical adjustment layer 52 and the third optical adjustment layer 53 intensify the resonance effect at the shorter wavelength side, the light emission efficiency for green and blue colors is higher than that in the comparative example. As a result, a display apparatus that consumes less power can be achieved in this practical example.

Although the above description is directed to a top emission type, the present invention can also be applied to a bottom emission type. Furthermore, a protection layer constituted of multiple layers may partially be used as an optical adjustment layer. For calculating the refractive indices, an optical apparatus of a spectral ellipsometry type or the like may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-175436 filed Aug. 4, 2010 and No. 2011-135602 filed Jun. 17, 2011, which are hereby incorporated by reference herein in their entirety.

What is claimed is:

1. A display apparatus comprising:
    an organic electroluminescent element that emits blue light;
    an organic electroluminescent element that emits green light; and
    an organic electroluminescent element that emits red light,
    wherein each organic electroluminescent element has a first electrode, a light-emitting layer, and a second electrode,
    wherein light emitted from each organic electroluminescent element is output from the second electrode,
    wherein a first optical adjustment layer having a thickness $d_1$ is provided on the second electrode of the organic electroluminescent element that emits red light, and
    wherein the thickness $d_1$ of the first optical adjustment layer satisfies the following mathematical expression A:

$$(4m_1-2\phi_1/\pi-3)\lambda_1/(8n_1) < d_1 < (4m_1-2\phi_1/\pi-1)\lambda_1/(8n_1) \quad (A)$$

where:
    $\lambda_1$ denotes a maximum peak wavelength of a spectrum of light emitted from the organic electroluminescent element that emits red light,
    $n_1$ denotes a refractive index of the first optical adjustment layer at the maximum peak wavelength $\lambda_1$,
    $\phi_1$ denotes a phase shift of the light output from the organic electroluminescent element that emits red light when the light is reflected at an interface of the first optical adjustment layer that is opposite to the second electrode, and
    $m_1$ denotes a positive integer.

2. The display apparatus according to claim 1, wherein the first optical adjustment layer having the thickness $d_1$ extends over the organic electroluminescent element that emits blue light and the organic electroluminescent element that emits green light.

3. The display apparatus according to claim 2, further comprising a second optical adjustment layer having a thickness $d_2$ disposed on the first optical adjustment layer,
    wherein the first optical adjustment layer and the second optical adjustment layer have different refractive indices and are disposed on each organic electroluminescent element,
    wherein the thickness $d_2$ of the second optical adjustment layer satisfies the following mathematical expression B:

$$(4m_2-2\phi_2/\pi-1)\lambda_2/(8n_2) < d_2 < (4m_2-2\phi_2/\pi+1)\lambda_2/(8n_2) \quad (B)$$

where:
    $\lambda_2$ denotes a maximum peak wavelength of a spectrum of light emitted from the organic electroluminescent element that emits blue light,
    $n_2$ denotes a refractive index of the second optical adjustment layer at the maximum peak wavelength $\lambda_2$,
    $\phi_2$ denotes a sum of a phase shift of light output from the organic electroluminescent element that emits blue light when the light emitted therefrom is reflected at an interface between the first optical adjustment layer and the second optical adjustment layer plus a phase shift of the light output from the organic electroluminescent element that emits blue light when the light emitted therefrom is reflected at an interface of the second optical adjustment layer that is opposite to the first optical adjustment layer, and
    $m_2$ denotes a positive integer.

4. The display apparatus according to claim 1, wherein the second electrode is composed of metal with a thickness ranging between 5 nm and 20 nm.

5. The display apparatus according to claim 4, wherein the second electrode includes silver.

6. The display apparatus according to claim 3, further comprising a third optical adjustment layer having a thickness $d_3$ disposed on the second optical adjustment layer of each organic electroluminescent element, wherein the third optical adjustment layer has a refractive index that is different from the refractive index of the second optical adjustment layer, wherein the thickness $d_3$ of third optical adjustment layer satisfies the following mathematical expression C:

$$(4m_3-2\phi_3/\pi-1)\lambda_2/(8n_3)<d_3<(4m_3-2\phi_3/\pi+1)\lambda_2/(8n_3) \quad (C)$$

where:
$n_3$ denotes a refractive index of the third optical adjustment layer at the maximum peak wavelength $\lambda_2$, $\phi_3$ denotes a sum of a phase shift of light output from the organic electroluminescent element that emits blue light when the light emitted therefrom is reflected at an interface between the second optical adjustment layer and the third optical adjustment layer plus a phase shift of the light output from the organic electroluminescent element that emits blue light when the light emitted therefrom is reflected at an interface of the third optical adjustment layer that is opposite to the second optical adjustment layer, and $m_3$ denotes a positive integer.

7. The display apparatus according to claim 2, wherein the thickness $d_1$ of the first optical adjustment layer satisfies the following mathematical expression D:

$$(4m_4-2\phi_4/\pi-1)\lambda_2/(8n_4)<d_1<(4m_4-2\phi_4/\pi+1)\lambda_2/(8n_4) \quad (D)$$

where:
$\lambda_2$ denotes a maximum peak wavelength of a spectrum of light emitted from the organic electroluminescent element that emits blue light, $n_4$ denotes a refractive index of the first optical adjustment layer at the maximum peak wavelength $\lambda_2$, $\phi_4$ denotes a phase shift of light output from the organic electroluminescent element that emits blue light when the light emitted therefrom is reflected at the interface of the first optical adjustment layer that is opposite to the second electrode, and $m_4$ denotes a positive integer.

8. The display apparatus according to claim 7, wherein the thickness $d_1$ of the first optical adjustment layer further satisfies the following mathematical expressions A' and D':

$$(8m_1-4\phi_1/\pi-5)\lambda_1/(16n_1)\leq d_1\leq(8m_1-4\phi_1/\pi-3)\lambda_1/(16n_1) \quad (A')$$

$$(8m_4-4\phi_4/\pi-1)\lambda_2/(16n_4)\leq d_1\leq(8m_4-4\phi_4/\pi+1)\lambda_2/(16n_4) \quad (D')$$

9. The display apparatus according to claim 3, wherein the thickness $d_2$ of the second optical adjustment layer further satisfies the following mathematical expression E:

$$(4m_5-2\phi_5/\pi-3)\lambda_1/(8n_5)<d_2<(4m_5-2\phi_5/\pi-1)\lambda_1/(8n_5) \quad (E)$$

where:
$n_5$ denotes a refractive index of the second optical adjustment layer at the maximum peak wavelength $\lambda_2$, $\phi_5$ denotes a sum of a phase shift of the light output from the organic electroluminescent element that emits red light when the light emitted therefrom is reflected at the interface between the first optical adjustment layer and the second optical adjustment layer plus a phase shift of the light output from the organic electroluminescent element that emits blue light when the light emitted therefrom is reflected at the interface of the second optical adjustment layer that is opposite to the first optical adjustment layer, and $m_5$ denotes a positive integer.

10. The display apparatus according to claim 9, wherein the thickness $d_2$ of the second optical adjustment layer further satisfies the following mathematical expressions B' and E':

$$(8m_2-4\phi_2/\pi-1)\lambda_2/(16n_2)\leq d_2\leq(8m_2-4\phi_2/\pi+1)\lambda_2/(16n_2) \quad (B')$$

$$(8m_5-4\phi_5/\pi-5)\lambda_1/(16n_5)\leq d_2\leq(8m_5-4\phi_5/\pi-3)\lambda_1/(16n_5) \quad (E')$$

11. The display apparatus according to claim 6, wherein the thickness $d_3$ of the third optical adjustment layer satisfies the following mathematical expression F:

$$(4m_6-2\phi_6/\pi-3)\lambda_1/(8n_6)<d_3<(4m_6-2\phi_6/\pi-1)\lambda_1/(8n_6) \quad (F)$$

where:
$n_6$ denotes a refractive index of the third optical adjustment layer at the maximum peak wavelength $\lambda_1$, $\phi_6$ denotes a sum of a phase shift of the light output from the organic electroluminescent element that emits red light when the light emitted therefrom is reflected at the interface between the second optical adjustment layer and the third optical adjustment layer plus a phase shift of the light output from the organic electroluminescent element that emits red light when the light emitted therefrom is reflected at the interface of the third optical adjustment layer that is opposite to the second optical adjustment layer, and $m_6$ denotes a positive integer.

12. The display apparatus according to claim 11, wherein the thickness $d_3$ of the third optical adjustment layer further satisfies the following mathematical expressions C' and F':

$$(8m_3-4\phi_3/\pi-1)\lambda_3/(16n_3)\leq d_3\leq(8m_3-4\phi_3/\pi+1)\lambda_3/(16n_3) \quad (C')$$

$$(8m_6-4\phi_6/\pi-5)\lambda_1/(16n_6)\leq d_3\leq(8m_6-4\phi_6/\pi-3)\lambda_1/(16n_6) \quad (F')$$

* * * * *